(12) United States Patent
DeLoach et al.

(10) Patent No.: US 7,320,927 B2
(45) Date of Patent: Jan. 22, 2008

(54) IN SITU HARDMASK PULLBACK USING AN IN SITU PLASMA RESIST TRIM PROCESS

(75) Inventors: Juanita DeLoach, Plano, TX (US); Brian A. Smith, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/689,177

(22) Filed: Oct. 20, 2003

(65) Prior Publication Data

US 2005/0085047 A1 Apr. 21, 2005

(51) Int. Cl.
*H01L 21/762* (2006.01)

(52) U.S. Cl. ............... 438/444; 438/424; 438/438; 438/700; 438/701; 438/713; 257/E21.546

(58) Field of Classification Search ........ 438/424, 438/427, 453, 618, 622, 636, 637, 444, 700, 438/710, 725, 701, 713, 435; 257/E21.546
See application file for complete search history.

(56) References Cited

U.S. PATENT DOCUMENTS

| | | | | |
|---|---|---|---|---|
| 4,487,652 A | * | 12/1984 | Almgren | 438/713 |
| 5,770,483 A | * | 6/1998 | Kadosh et al. | 438/152 |
| 6,093,621 A | * | 7/2000 | Tseng | 438/424 |
| 6,218,309 B1 | * | 4/2001 | Miller et al. | 438/700 |
| 6,261,921 B1 | * | 7/2001 | Yen et al. | 438/424 |
| 6,271,143 B1 | | 8/2001 | Mendicino | |
| 6,696,366 B1 | * | 2/2004 | Morey et al. | 438/712 |
| 6,812,145 B2 | * | 11/2004 | Ma | 438/653 |
| 2002/0132422 A1 | * | 9/2002 | Ranade et al. | 438/243 |
| 2002/0166838 A1 | * | 11/2002 | Nagarajan | 216/2 |

* cited by examiner

*Primary Examiner*—M. Wilczewski
(74) *Attorney, Agent, or Firm*—Jacqueline J. Garner; W. James Brady, III; Frederick J. Telecky, Jr.

(57) ABSTRACT

The present invention provides a process of manufacturing an isolation structure for use in a semiconductor device. The process includes forming an opening in a substrate through a patterned photoresist layer 225 and a hardmask layer 215 located over the substrate 205 with plasma, trimming the photoresist layer 225 with a plasma to create an exposed portion 215a of the hardmask layer 215, removing the exposed portion 215a with a plasma to create a trench guide opening 227, and creating a trench 230 through the trench guide opening 227 with a plasma.

20 Claims, 6 Drawing Sheets

IN SITU HARDMASK PULLBACK USING AN IN SITU PLASMA RESIST TRIM PROCESS

TECHNICAL FIELD OF THE INVENTION

The present invention is directed, in general, to a method of manufacturing a semiconductor device and more specifically to a method of forming an isolation structure using an in situ hardmask plasma pullback process.

BACKGROUND OF THE INVENTION

In the fabrication of integrated circuits (ICs), trench isolation is frequently used to replace more conventional local oxidation of silicon in order to form improved field isolation structures. In the formation of such trench isolation structures shown in FIG. 1A, a pad oxide 110 is first grown over a silicon substrate 115, which is followed by the deposition of a silicon nitride layer 120. The silicon nitride layer 120 is patterned, typically with a photoresist 123, to form a trench 125, after which, the photoresist 123 is removed and an oxide liner 130 is then subsequently formed in the trench 125. This is followed by a wet etch nitride pullback process, which pulls the nitride back from the edge of the trench 125 and well within an active area 127, as shown in FIG. 1B. The nitride pullback is achieved with a combination of hydrofluoric acid (HF) and phosphoric acid used in sequence. During the nitride pullback, it is important to note that a portion of the oxide liner 130 can be removed, which will cause the oxide liner 130 to recede within the trench, as illustrated. As discussed below, this removal or thinning of the oxide liner 130 is undesirable.

Next, as illustrated in FIG. 1C, a high-density plasma deposition process is conducted to fill the trench 125 with an oxide 135. Following this deposition step, the excess oxide 135 is removed via a chemical mechanical polishing (CMP) process, and the silicon nitride layer 120 is removed. Following the nitride pullback, the pad oxide 110 layer is removed, which results in a trench isolation structure 140 shown in FIG. 1C. A gate oxide process is then conducted to obtain a high quality gate oxide for the later deposited gate.

Several problems arise, however, with this process that the industry is presently seeking to improve. For example, during the oxide liner anneal step, a portion of the silicon nitride layer is converted to an oxy-nitride that creates a variably thick oxy-nitride layer. This oxy-nitride layer can cause significant variation in the subsequent wet etch rate of the silicon nitride layer. This, in turn, can become a problem for subsequent processes because a targeted amount of the silicon nitride layer may or may not be achieved.

Typically, it is desirable to leave a targeted amount of silicon nitride on the substrate for CMP purposes because it serves as a stopping layer for the oxide removal. If the amount of nitride present varies due to the variation in the wet etch rate, errors may be introduced in the amount of oxide removed during the CMP process, resulting in varying levels of planarization. This, in turn, will result in undesirable variations in the isolation of the transistors across a wafer or a device.

In addition, the HF treatment leads to a loss or thinning of the liner oxide near the silicon edges of the trench. This can be a problem because the loss or thinning of the liner oxide at the edges can ultimately cause leakage in the device. Further, the removal of the pad oxide 110 and the process used to form the gate oxide creates divots 145 on the sides of the trench isolation structure 140 due to the loss of oxide during these steps, as shown in FIG. 1D. These divots 145 can extend below the upper edge of an active area 150. When the polysilicon is deposited over this structure, the amount of polysilicon in the divots 145 may be twice as much as the polysilicon over the active region 150 where the gate is to be formed. This significant difference in the thickness of the polysilicon makes subsequent etching of the gates more difficult because the polysilicon in the divots 145, which is thicker than the polysilicon over the active area 150, must be removed. This, in turn, makes gate definition more difficult because the critical dimensions of the gate may vary and may not be well controlled due to the removal of the excess polysilicon around the divot areas. Loss of control of the gate dimensions at the edge of the active region can lead to excessive transistor leakage current as well as other yield loss due to mismatched transistor performance.

Therefore what is needed in the art is a method that avoids the disadvantages associated with these prior art processes.

SUMMARY OF THE INVENTION

To address the above-discussed deficiencies of the prior art, the present invention provides a process of manufacturing a semiconductor feature for use in a semiconductor device. In one embodiment, the process includes forming an opening in a substrate through a patterned photoresist layer and a hardmask layer located over the substrate with a plasma, trimming the photoresist layer with a plasma to create an exposed portion of the hardmask layer, removing the exposed portion with a plasma to create a trench guide opening, and creating a trench through the trench guide opening with a plasma.

In another embodiment, the present invention provides a process of manufacturing an integrated circuit that includes forming an isolation structure on a substrate adjacent an active region of the substrate. In the particular embodiment, the isolation structure is formed by forming an opening in a substrate through a patterned photoresist layer and a hardmask layer located over the substrate with a plasma, trimming the photoresist layer with a plasma to create an exposed portion of the hardmask layer, removing the exposed portion with a plasma to create a trench guide opening, and creating a trench through the trench guide opening with a plasma. The process further includes forming transistors on the active region and forming interconnects in dielectric layers located over the transistors such that they interconnect the transistors to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying Figures. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

The present invention recognizes the advantages associated with using an in situ plasma resist trim process to pull back the edge of a hardmask layer during the formation of a shallow-trench isolation structure. This process allows for a more controlled pullback of the hardmask, which allows for a more accurate control of the amount of hardmask that is available as a stopping layer for subsequent CMP processes. The use of the present invention also minimizes oxide liner and fill oxide loss from the trench isolation structure associated with subsequent processing steps. This minimization in the loss of these oxides yields a more robust device because oxide divot formation is significantly reduced or eliminated. This, in turn, decreases the amount of polysilicon that must be removed within the divot area, and thus, allows more accurate control of the critical gate dimensions in this region of the transistor. Additionally, the minimized oxide liner loss substantially reduces the amount of current leakage associated with the prior art processes. Thus, the process offered by the present invention provides for a more controlled hardmask removal that, in turn, allows for a more controlled gate formation, that in turn, allows for better controlled gate formation, CMP process and reduced current leakage.

Figure 1A:
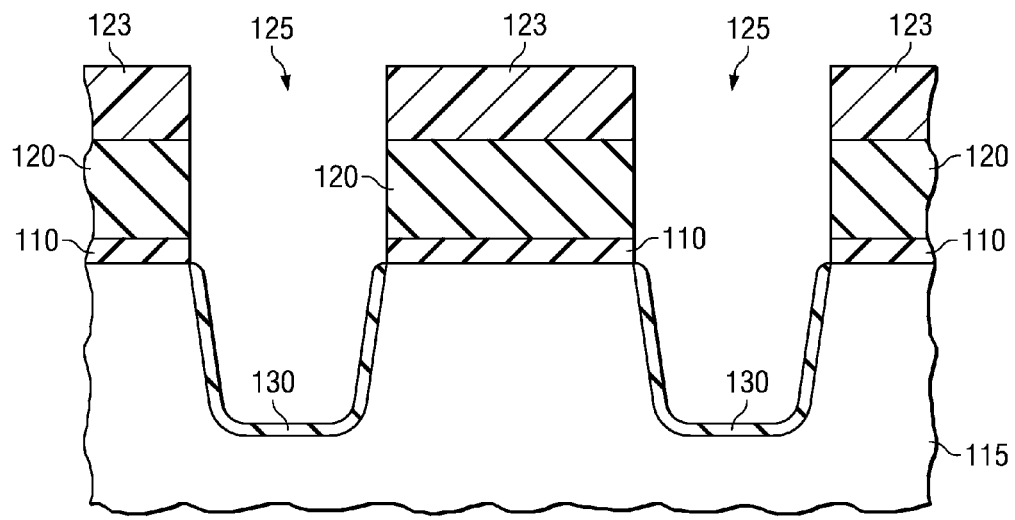
FIG. 1A is a sectional view of a trench having an oxide liner therein formed prior to a conventional nitride pullback process.
Figure 1B:
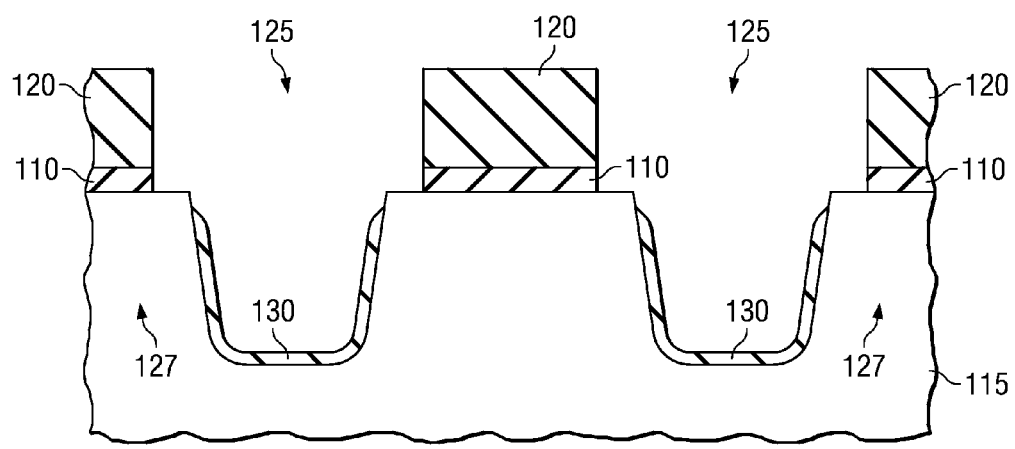
FIG. 1B is a sectional view of the device illustrated in FIG. 1A subsequent to a conventional nitride pullback process.
Figure 1C:
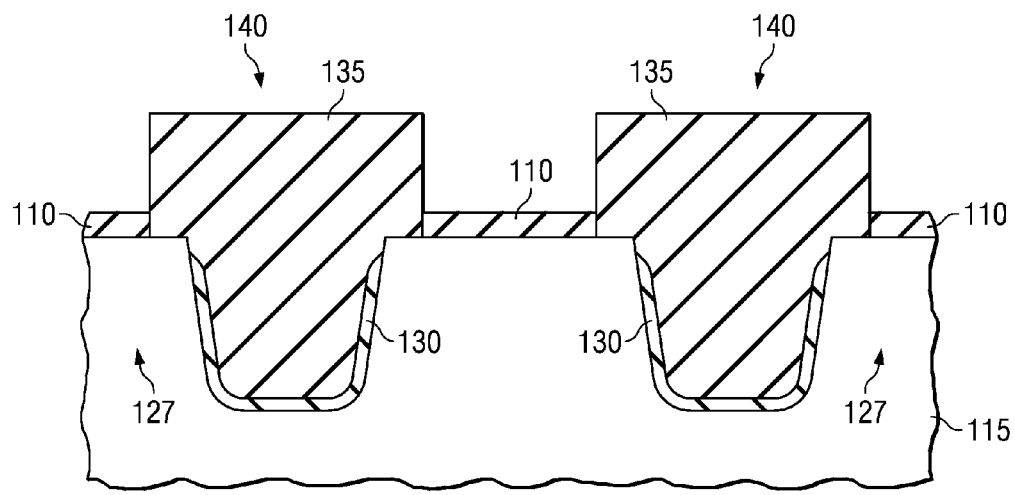
FIG. 1C is a sectional view of the device illustrated in FIG. 1B subsequent to a conventional oxide fill and a planarization process.
Figure 1D:
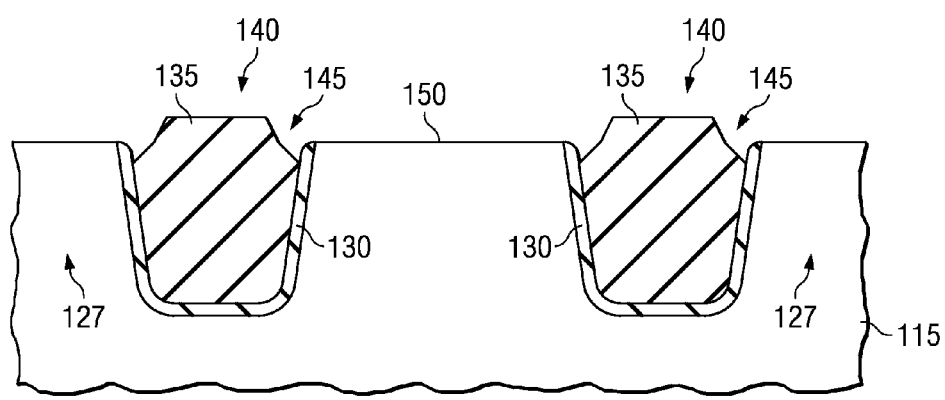
FIG. 1D is a sectional view of the device illustrated in FIG. 1C subsequent to a conventional oxide fill, a planarization process, removal of the silicon nitride and pad oxide and formation of a gate oxide.
Figure 2A:
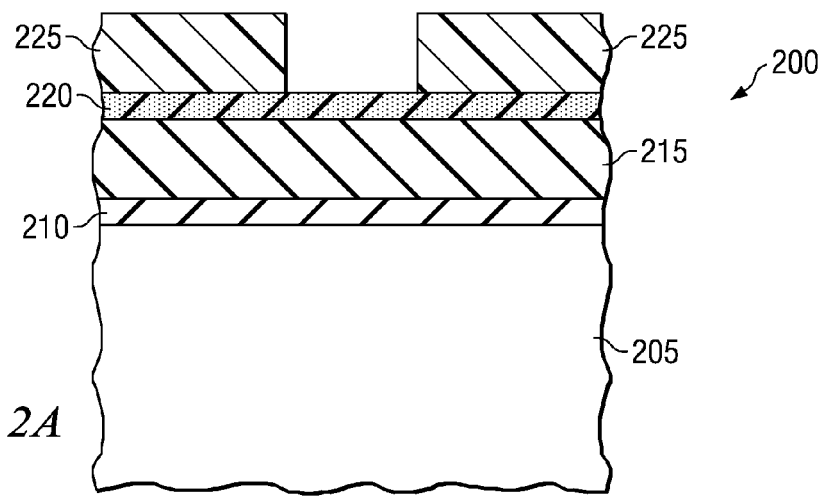
FIG. 2A is an enlarged sectional view of a semiconductor device subsequent to patterning a photoresist overlying a BARC layer, a hardmask layer and a pad oxide layer.

FIG. 2A is a close-up, sectional view of a semiconductor device 200 shown at an intermediate point of fabrication. The semiconductor device 200 includes a substrate 205, such as silicon or other well know semiconducting material, on which a pad oxide 210, a hardmask layer 215, a bottom anti-reflective coating (BARC) layer 220 and a patterned photoresist layer 225 have been conventionally deposited and patterned. All of these layers may be comprised of conventional materials. For example, the hardmask 210 may be silicon nitride. In an advantageous embodiment, as provided by the present invention, the photoresist is patterned with a photolithography tool, such as a scanner. Subsequently, the resist pattern is trimmed in an etcher to achieve the desired amount of pullback.

Figure 2B:
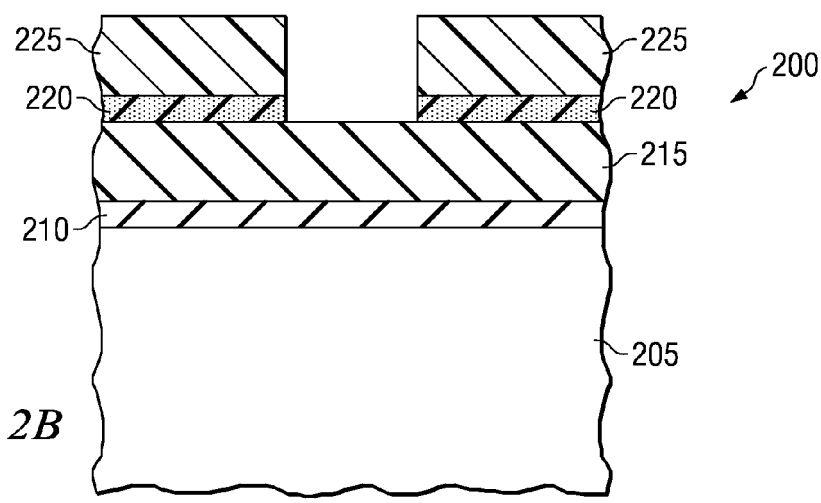
FIG. 2B is an enlarged sectional view of the device of FIG. 2A subsequent to the removal of the BARC layer exposed by the patterned photoresist.

Turning now to FIG. 2B, there is illustrated a close-up sectional view of the semiconductor device 200 after a BARC etch that removes the BARC layer 220 that is exposed in the opening of the patterned photoresist 225. In an advantageous embodiment, the BARC etch is also conducted in the same plasma tool used to trim the photoresist 225 and etch the hardmask and trench. In one particular embodiment, the plasma BARC etch may be conducted at a source power ranging from about 100 watts to about 400 watts, a bias power ranging from about 50 watts to about 150 watts and by using a etching gas comprising gases like HBr, $Cl_2$, $O_2$, $N_2$, etc., wherein a flow rate of each of these gases ranges from about 10 sccm to about 100 sccm (standard cubic centimeters/minute). It should be understood that the present invention is not limited to any particular power settings, etching chemistry or other plasma etching conditions. The explicit embodiments discussed herein are given as examples only, and one who is skilled in the art understands how to alter the power, etching chemistries, or pressures to achieve the same results.

Figure 2C:
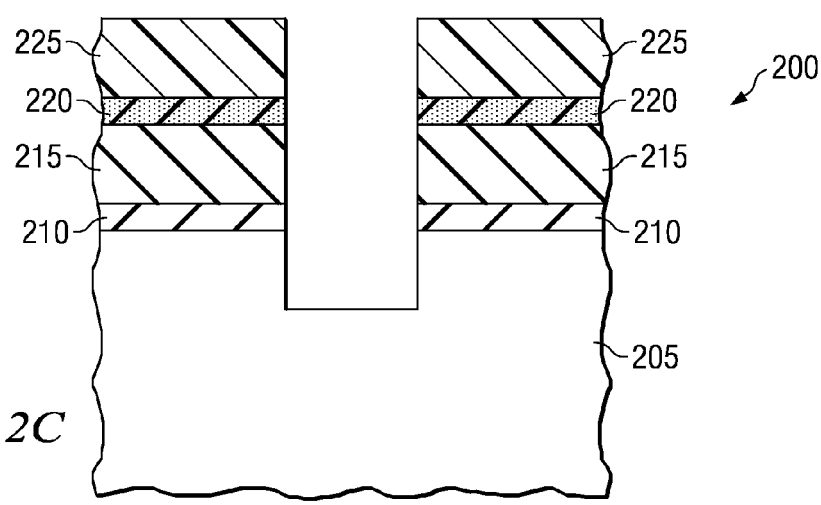
FIG. 2C is an enlarged sectional view of the device of FIG. 2B subsequent to the removal of the hardmask layer and the pad oxide layer exposed by the patterned photoresist and etched BARC layer.

Following the BARC layer 220 etch, a portion of the hardmask layer 215 that is exposed through the opening in the photoresist layer 225 and the BARC layer 220 is removed with a plasma etch, as shown in FIG. 2C. FIG. 2C is a close-up sectional view of the semiconductor device 200 of FIG. 2B, after the removal and over etch of the hardmask layer 215. In a preferred embodiment, this plasma etch is also conducted in the same plasma tool used to remove the BARC layer 220. As stated above, the hardmask layer 215, in one embodiment, may be silicon nitride; however, other materials such as oxy-nitride, silicon, silicon carbide or combinations thereof may also be used. As shown in FIG. 2C, an over etch of the hardmask layer 215 is conducted, which not only removes the underlying pad oxide 210, but also etches a short amount into the underlying substrate 205. In one particular embodiment, the plasma etch of the hardmask layer 215, including the over etch, may be conducted at the source power ranging from about 100 watts to about 400 watts, a bias power ranging from about 50 watts to about 150 watts and by using a etching gas comprising gases like HBr, $Cl_2$, $O_2$, $N_2$, etc., wherein a flow rate of each of these gases ranges from about 10 sccm to about 100 sccm.

Figure 2D:
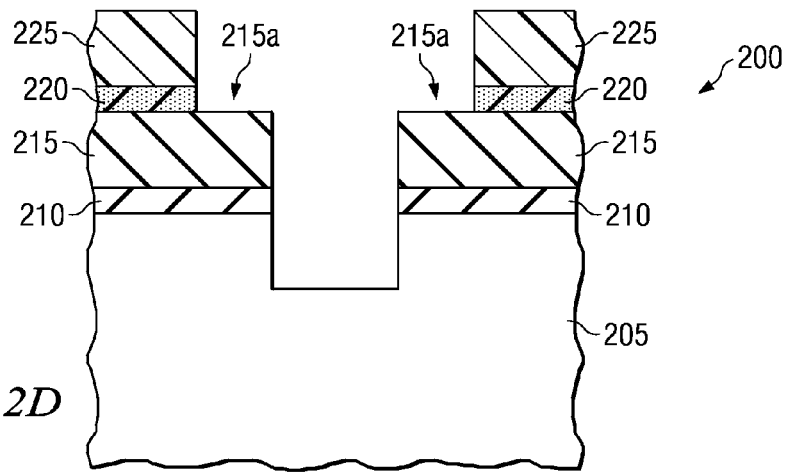
FIG. 2D is an enlarged sectional view of the device of FIG. 2C following the resist trim process.

After the hardmask 215 is etched, a resist trim step is then conducted. FIG. 2D shows the semiconductor device 200 subsequent to this resist trim step. As illustrated, the photoresist layer 225 and the BARC layer 220 have been trimmed back. A plasma etch may also be used to conduct the resist trim. In fact, in an advantageous embodiment, the plasma trim etch is conducted in the same tool as the previously discussed steps. This trim step exposes a small portion 215a of the underlying hardmask 215, and because it is done with a dry plasma process, versus a conventional wet etch, the amount of trim removed can be accurately controlled, thereby exposing only the desired amount of hardmask layer 215 that is intended to be removed in subsequent steps. In one particular embodiment, the trim etch may be conducted at a source power ranging from about 300 watts to about 700 watts, a bias power ranging from about 0 watts to about 150 watts and by using an etching gas comprising gases like HBr, $O_2$, Ar, etc., wherein a flow rate of each of these gases ranges from about 20 sccm to about 80 sccm and at a pressure ranging from about 4 millitorr to about 20 millitorr.

Figure 2E:
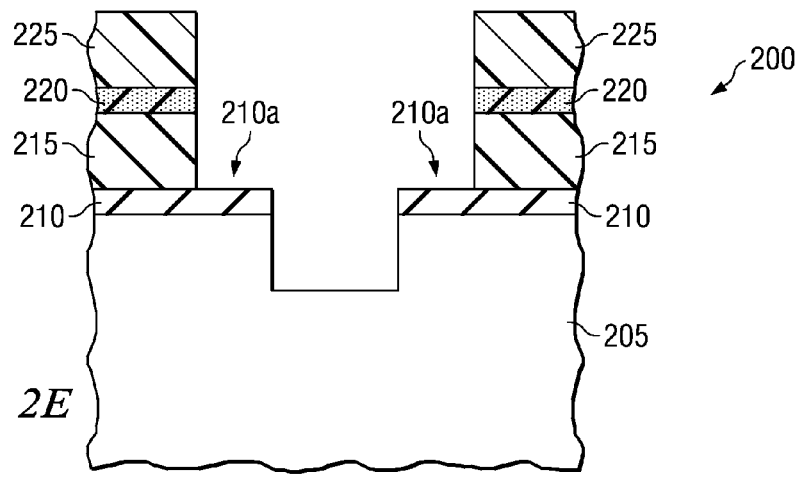
FIG. 2E is an enlarged sectional view of the device of FIG. 2D following a hardmask pullback process.

Turning now to FIG. 2E, a hardmask pullback step is conducted. In the illustrated embodiment, the portions 215a of the hardmask layer 215 have been removed with a plasma etch to form a trench guide opening. Preferably, the pullback etch is conducted in the same plasma tool as the previously described steps. Since only the portions 215a of the hardmask layer 215 are exposed to the plasma etch, it is only those portions that are removed. Thus, there is substantially more control involved in the amount of the hardmask that is being removed. This is in contrast to conventional wet etch processes wherein the entire nitride layer is exposed to the etch. As discussed above, this over exposure introduces a large degree of uncertainty regarding the amount of hardmask removed during the pullback step. In one particular embodiment, the pullback etch may be conducted at a source power ranging from about 400 watts to about 600 watts, a bias power of ranging from about 0 watts to about 200 watts and by using an etching gas comprising gases like $CF_3$, $CF_4$, etc., and at a pressure ranging from about 15 millitorr to about 45 millitorr, wherein a flow rate of each of these gases ranges from about 225 sccm to about 260 sccm. It should be noted that at this point exposed portions 210a of the pad oxide layer 210 remain after the hardmask pullback. Following the pullback etch, the photoresist layer 225 and the BARC layer 220 are preferably removed in the same plasma tool using a conventional plasma etch.

Figure 2F:
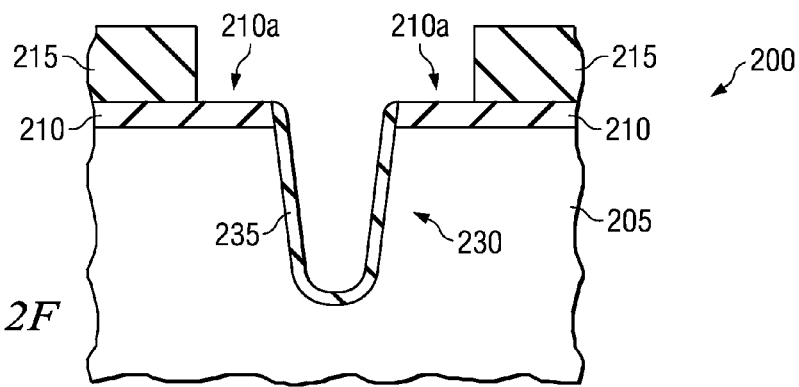
FIG. 2F is an enlarged sectional view of the device of FIG. 2E following the hardmask pullback and the trench and oxide liner formation and removal of the photoresist and BARC layers.

After the hardmask pullback step and the removal of the photoresist and BARC layers 225 and 220, a conventional plasma etch is conducted to form a trench 230 in the substrate 205, as shown in FIG. 2F. In one particular embodiment, the plasma etch is a silicon plasma etch that may be conducted at a source power ranging from about 250 watts to about 450 watts, a bias power of ranging from about 100 watts to about 200 watts and by using an etching gas comprising gases like, $Cl_2$, $O_2$, $N_2$, etc., wherein a flow rate of each of these gases ranges from about 25 sccm to about 180 sccm.

Subsequent to the formation of the trench 230, the semiconductor device 200 is, in an advantageous embodiment, moved from the plasma tool to a furnace. An oxide liner 235, which is also shown in FIG. 2F, is conventionally grown and is followed by an oxide liner anneal. Since the oxide liner 235 is grown after the hardmask pullback, the disadvantages associated with the conventional pullback process are avoided because the oxide liner 235 is not present to be partially removed during the pullback step. Thus, the oxide liner 235 is in solid contact with the silicon at its upper edge, and is, therefore, less susceptible to current leakage.

Figure 3A:
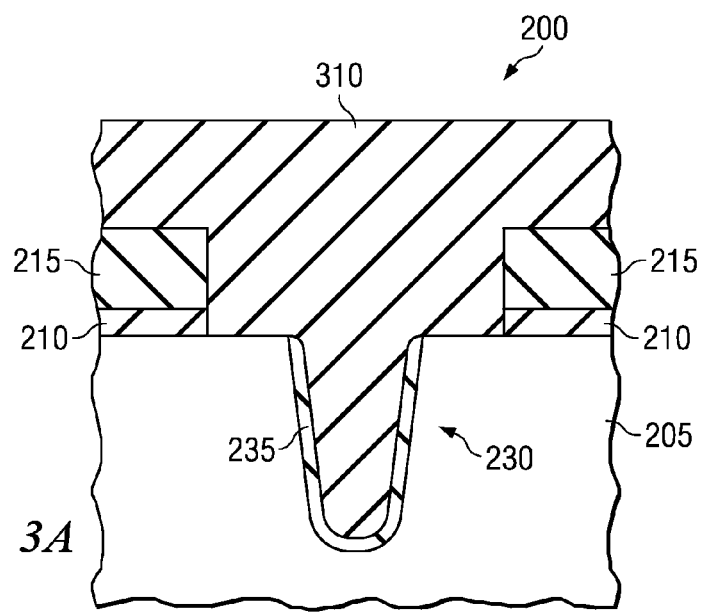
FIG. 3A is an enlarged sectional view of the device of FIG. 2F following the deposition of a dielectric material in the trench.
Figure 3B:
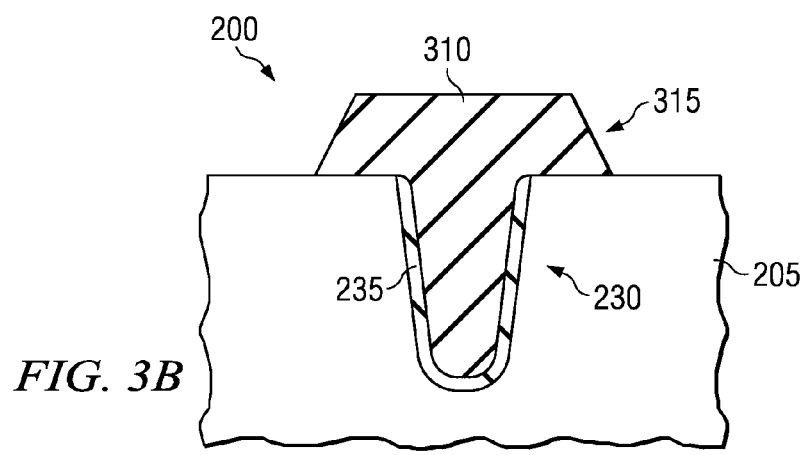
FIG. 3B is an enlarged sectional view of the device of FIG. 3A after the removal of the hardmask and pad oxide layers.

Turning now to FIG. 3A, following the oxide liner anneal, a conventional high density plasma deposition is then used to fill the trench 230 with a dielectric material 310, such as silicon dioxide. The dielectric material 310 completely fills the trench 230 and overlays the remaining hardmask layer 215 and pad oxide layer 210, as shown in FIG. 3A. The portion of the pad oxide layer 210 that lies under the deposited dielectric material 310 merges with the deposited dielectric to form a portion of the dielectric material 310 as indicated in FIG. 3A. The dielectric material 310 is then planarized down to the top of the hardmask layer 215 using a conventional CMP process to achieve a substantially planar device, as shown in FIG. 3B. The remaining portion of the hardmask layer 215 and the pad oxide layer 210 are then removed resulting in an isolation structure 315, illustrated FIG. 3B. At this point a small amount of the dielectric material 310 may be removed from the isolation structure due to the hardmask and pad oxide removal, but not enough to make a significant effect on subsequent fabrication processes.

Figure 3C:
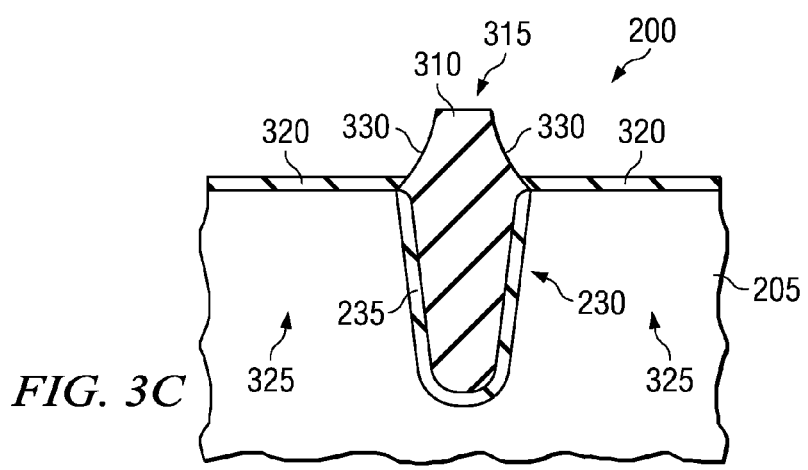
FIG. 3C is an enlarged sectional view of the device of FIG. 3B after formation of a gate oxide layer.

Turning now to FIG. 3C, after the removal of the hardmask layer 215 and the pad oxide layer 210, a gate oxide 320 is conventionally grown over active regions 325 that are adjacent the isolation structure 315, after which, a gate, which is not shown is conventionally formed on the active regions 325. During the gate oxide formation process, side portions of the isolation structure 315 are removed, and while small divots 330 may form, if they form at all, they are not as pronounced or as deep as the divots produced by prior art processes. In either event, however, it should be noted that there is good contact between the edge of the substrate 205 and the oxide liner 235, which minimizes current leakage that is associated with conventional processes. Additionally, the amount of gate material, such as polysilicon, that must be removed during gate formation is substantially reduced due to the shallower divots 330, or in some cases, due to their absence altogether. Thus, achieving targeted critical gate dimensions in subsequent gate formation process is more assured because the excess polysilicon is more easily removed without affecting the critical dimensions of the resulting gate.

Figure 4:
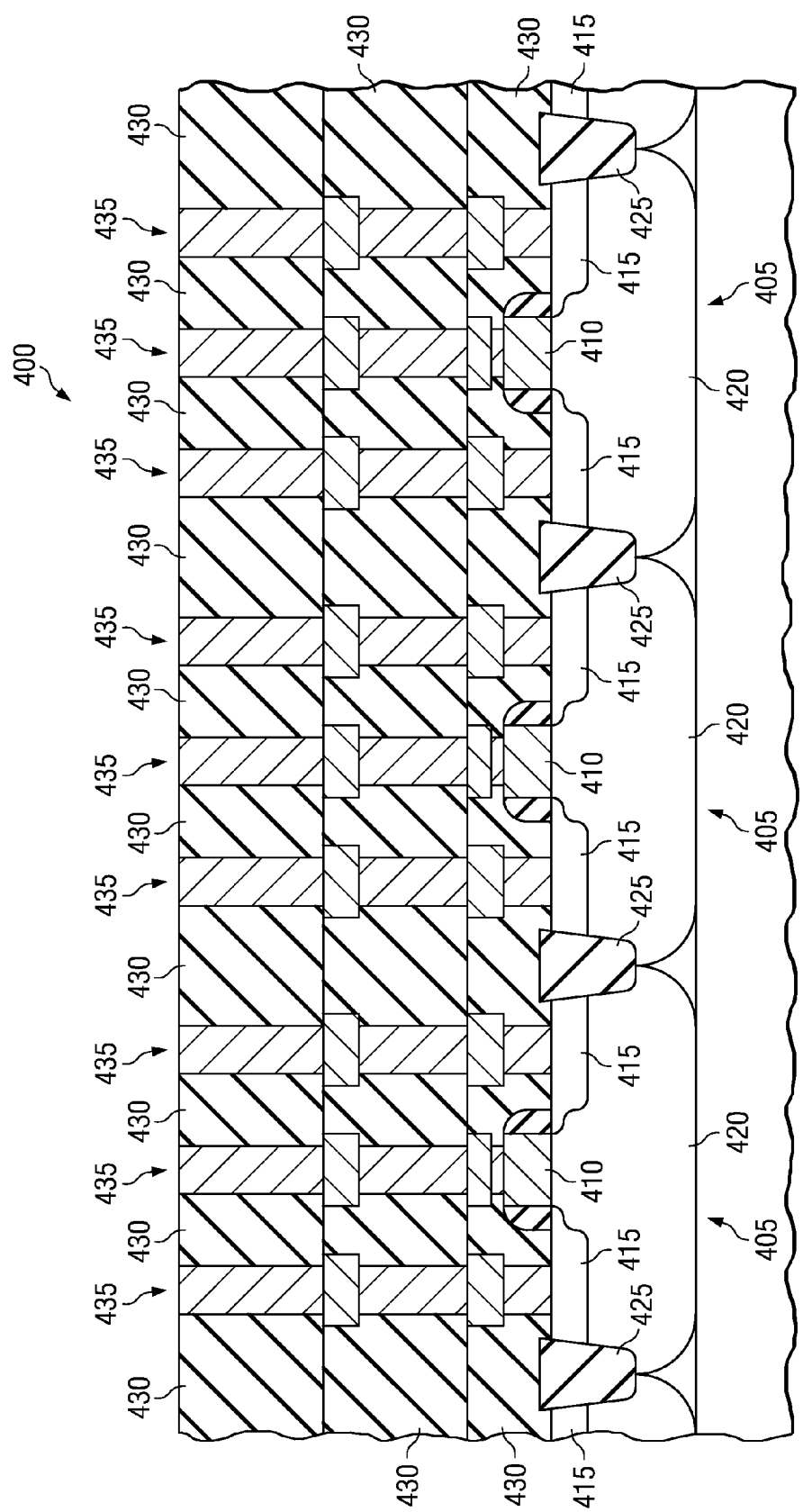
FIG. 4 is a sectional view an integrated circuit device that can be formed using the process provided by the present invention.

The above process can be used to construct an integrated circuit, such as a complementary metal oxide semiconductor (CMOS) device. An exemplary integrated circuit is shown in FIG. 4. Those who are skilled the art understand how to incorporate the present invention into a process flow to construct such a device. FIG. 4 is an example of one such integrated circuit device. The integrated circuit 400 includes transistors 405 that include gates 410 and source/drains 415 formed in wells 420, which can be doped to form a complementary metal oxide semiconductor design layout. Isolation structures 425 that are fabricated in accordance with the present invention, such as shallow trench isolation (STI) structures, separate and electrically isolate the transistors 405 from each other. Interlevel dielectric layers 430 are located over the transistors 405 and interconnects 435 are formed therein to interconnect the various transistors 405 to form an operative integrated circuit. The process discussed above and covered by the present invention, while primarily discussed with reference to isolation structures, may be used to form any of these structures where a hardmask is used to form the structure. Given the teachings of present application, one who is skilled in the art would know how to form an operative integrated circuit as shown in FIG. 4.

Although the present invention has been described in detail, one of ordinary skill in the art should understand that they can make various changes, substitutions and alterations herein without departing from the scope of the invention.

What is claimed is:

1. A process of fabricating an integrated circuit, comprising:
forming an opening in a substrate through a patterned photoresist layer and a hardmask layer located over said substrate with a plasma;
trimming said photoresist layer with a plasma to create an exposed portion of said hardmask layer;
removing said exposed portion with a plasma to create a trench guide opening; and
after removing said exposed portion, creating a trench through said trench guide opening with a plasma.

2. The process as recited in claim 1 wherein forming said opening comprises patterning an opening through a bottom anti-reflective coating (BARC) layer located between said photoresist and said hardmask layer and a pad oxide located between said substrate and said hardmask layer.

3. The process as recited in claim 1 wherein said hardmask layer is a silicon nitride layer.

4. The process as recited in claim 1 wherein said forming, said trimming, said creating, and said removing are conducted in a same plasma tool.

5. The process as recited in claim 1 further comprising forming an oxide liner in said trench.

6. The process as recited in claim 5 furthering comprising depositing an oxide in said trench to form an isolation structure.

7. The process as recited in claim 6 further comprising removing said hardmask subsequent to forming said isolation structure.

8. The process as recited in claim 1 wherein said trimming comprises trimming with a plasma having a source power ranging from about 300 watts to about 700 watts, a bias power ranging from about 0 watts to about 150 watts.

9. The process as recited in claim 8 wherein said trimming comprises using gases including HBr, $O_2$, and Ar and a flow rate of each of said gases ranges from about 20 sccm to about 80 sccm.

10. The process as recited in claim 1 wherein creating said trench comprises forming said trench adjacent an active region of said substrate.

11. A process of manufacturing an integrated circuit, comprising:
forming an isolation structure on a substrate adjacent an active region of said substrate, comprising:
forming an opening in a substrate through a patterned photoresist layer and a hardmask layer located over said substrate with plasma;
trimming said photoresist layer with a plasma to create an exposed portion of said hardmask layer;
removing said exposed portion with a plasma to create a trench guide opening; and
after removing said exposed portion, creating a trench through said trench guide opening with a plasma;
forming transistors on said active region; and
forming interconnects in dielectric layers located over said transistors, said interconnects interconnecting said transistors to form an operative integrated circuit.

12. The process as recited in claim 11 wherein forming said opening comprises patterning an opening through a bottom anti-reflective coating (BARC) layer located between said photoresist and said hardmask layer and a pad oxide located between said substrate and said hardmask layer.

13. The process as recited in claim 11 wherein said hardmask layer is a silicon nitride layer.

14. The process as recited in claim 11 wherein said forming an opening, said trimming, said creating, and said removing are conducted in a same plasma tool.

15. The process as recited in claim 11 further comprising forming an oxide liner in said trench.

16. The process as recited in claim 15 furthering comprising depositing an oxide in said trench to form said isolation structure.

17. The process as recited in claim 16 further comprising removing said hardmask subsequent to forming said isolation structure.

18. The process as recited in claim 11 wherein said trimming comprises trimming with a plasma having a source power ranging from about 300 watts to about 700 watts, a bias power ranging from about 0 watts to about 150 watts.

19. The process as recited in claim 18 wherein said trimming comprises including HBr, $O_2$, and Ar and a flow rate of each of said gases ranges from about 20 sccm to about 80 sccm.

20. The process as recited in claim 18 wherein forming said transistors comprises forming wells and source and drain regions in said active region.

* * * * *